US011719655B2

(12) United States Patent
Chen et al.

(10) Patent No.: US 11,719,655 B2
(45) Date of Patent: Aug. 8, 2023

(54) METHOD FOR MEASURING OIL-WATER DISTRIBUTION USING DYNAMIC NUCLEAR POLARIZATION FOR MAGNETIC RESONANCE IMAGING (DNP-MRI)

(71) Applicant: Innovation Academy For Precision Measurement Science And Technology, Chinese Academy of Sciences, Wuhan (CN)

(72) Inventors: Li Chen, Wuhan (CN); Junfei Chen, Wuhan (CN); Chaoyang Liu, Wuhan (CN); Zhen Zhang, Wuhan (CN); Tao Feng, Wuhan (CN); Jiwen Feng, Wuhan (CN); Fang Chen, Wuhan (CN)

(73) Assignee: Innovation Academy For Precision Measurement Science And Technology, Chinese Academy of Sciences, Wuhan (CN)

( * ) Notice: Subject to any disclaimer, the term of this patent is extended or adjusted under 35 U.S.C. 154(b) by 71 days.

(21) Appl. No.: 17/520,122

(22) Filed: Nov. 5, 2021

(65) Prior Publication Data
US 2022/0057346 A1 Feb. 24, 2022

Related U.S. Application Data

(63) Continuation of application No. PCT/CN2020/085475, filed on Apr. 18, 2020.

(30) Foreign Application Priority Data

May 8, 2019 (CN) .......................... 201910380282.5

(51) Int. Cl.
*G01N 24/08* (2006.01)
*G01R 33/44* (2006.01)
*G01R 33/565* (2006.01)

(52) U.S. Cl.
CPC ......... *G01N 24/081* (2013.01); *G01R 33/448* (2013.01); *G01R 33/56509* (2013.01)

(58) Field of Classification Search
CPC ............ G01R 33/448; G01R 33/56509; G01N 24/081
See application file for complete search history.

(56) References Cited

U.S. PATENT DOCUMENTS 7,906,962 B2 * 3/2011 Han ................. G01R 33/56366
324/307
10,948,439 B2 * 3/2021 AlSinan ................. G01R 33/44
(Continued)

*Primary Examiner* — Gregory H Curran
(74) *Attorney, Agent, or Firm* — Mei & Mark LLP; Manni Li

(57) ABSTRACT

A method for measuring oil-water distribution using DNP-MRI, comprising adding a free radical for DNP enhanced NMR signal of a water phase or an oil phase in a sample containing oil and water; performing an MRI experiment on the sample, and collecting an MRI image of the sample without DNP enhancement; applying microwave excitation for DNP-MRI experiment under the same MRI experiment condition as step 2, and collecting an MRI image of the sample after DNP enhancement; and comparing the MRI image after DNP enhancement with the MRI image without DNP enhancement. In the MRI image with DNP enhancement, an area with enhanced MRI signal intensity is a selectively enhanced fluid phase distribution area, and an area without obviously changed MRI signal intensity is a non-selectively enhanced fluid phase distribution area. The method is simple, convenient to operate, short in measurement time, and high in measurement efficiency.

3 Claims, 2 Drawing Sheets

(56) References Cited

U.S. PATENT DOCUMENTS

| | | |
|---|---|---|
| 2015/0219734 A1 | 8/2015 | Gajan et al. |
| 2017/0254920 A1 | 9/2017 | Appel et al. |
| 2018/0340997 A1* | 11/2018 | Ibragimova ............ G01N 24/12 |
| 2019/0113649 A1 | 4/2019 | Tian et al. |
| 2020/0292640 A1 | 9/2020 | Rahimi-Keshari et al. |

* cited by examiner

METHOD FOR MEASURING OIL-WATER DISTRIBUTION USING DYNAMIC NUCLEAR POLARIZATION FOR MAGNETIC RESONANCE IMAGING (DNP-MRI)

CROSS-REFERENCE TO RELATED APPLICATIONS

The subject application is a continuation of PCT/CN2020/085475 filed on Apr. 18, 2020, which claims priority on Chinese Application No. CN201910380282.5 filed on May 8, 2019 in China. The contents and subject matter of the PCT international application and the Chinese priority application are incorporated herein by reference.

BACKGROUND OF THE INVENTION

Technical Field

The invention belongs to the technical field of nuclear magnetic resonance applications, and particularly relates to a method for measuring oil-water distribution using DNP-MRI, which can be applied to analysis of distribution and flow laws of fluids in a porous material.

Description of Related Art

Porous materials such as reservoir rocks are rich in different fluid phases such as oil and water. The distribution of oil and water in rock formations is a key issue in the exploration of seepage/displacement laws. The acquisition of two-phase distribution information helps to understand important parameters such as two-phase saturation and relative permeability, and provides reference for reservoir evaluation and exploration.

NMR technology is widely used in the study of the structure and fluid properties of porous materials such as cores due to its non-destructive testing characteristics.

Under high-field NMR, based on the difference in chemical shift of $^1H$ between oil and water, chemical shift imaging can be used to obtain two-phase fluid distribution. However, the resolution of the two-phase chemical shift spectrum in the material is not high due to the influence of the internal magnetic field gradient caused by the difference in the magnetic susceptibility between the solid and liquid phases in the material. The high field is not suitable for the study of materials, especially for non-homogeneous materials such as cores. The smaller the pore size, the larger the internal magnetic field gradient, which will cause the NMR signal in the small pore size to attenuate quickly or even be unmeasurable, thereby further reducing the reliability of test results.

In order to reduce the magnetic field gradient caused by the solid-liquid two-phase magnetic susceptibility, the application research of porous materials such as cores is mostly carried out at low-field. Different fluids are mostly distinguished by the relaxation or diffusion characteristics of the sample at low field. However, due to the inhomogeneity of the material structure and the difference in fluid distribution, different fluids may have the same relaxation or diffusion characteristics and thus cannot be effectively distinguished. In addition, the low NMR sensitivity and resolution greatly increase the test time of samples, and further limit the application of conventional MRI methods in measurement of oil-water distribution. In order to shorten the test time of the samples and improve the efficiency and reliability of the low-field MRI method, it is required to find a new method to improve the sensitivity of NMR.

BRIEF SUMMARY OF THE INVENTION

In view of the above-mentioned problems in the prior art, the invention provides a method for measuring oil-water distribution using DNP-MRI, which is simple, convenient to operate, short in measurement time, and high in measurement efficiency.

A technical solution adopted to achieve the above-mentioned objective of the invention is as follows.

A method for measuring oil-water distribution using DNP-MRI, including the following steps:

1. adding a free radical for DNP enhanced an NMR signal of a water phase or an oil phase in a to-be-tested sample containing oil and water;

2. performing an MRI experiment on the to-be-tested sample, and collecting an MRI image of the to-be-tested sample without DNP enhancement;

3. applying microwave excitation for a DNP-MRI experiment under the same MRI experiment condition as step 2, and collecting an MRI image of the to-be-tested sample after DNP enhancement;

4. comparing the MRI image after DNP enhancement with the MRI image without DNP enhancement, wherein in the MRI image after DNP enhancement, an area with an enhanced MRI signal intensity is a selectively enhanced fluid phase distribution area, and an area without an obviously changed MRI signal intensity is a non-selectively enhanced fluid phase distribution area.

Further, the free radical is a non-selective free radical that is able to simultaneously enhance NMR signals of both the water phase and the oil phase. If only the NMR signal of the water phase needs to be enhanced, a relaxation reagent that is able to enhance relaxation of the oil phase is added. If only the NMR signal of the oil phase needs to be enhanced, a relaxation reagent that is able to enhance relaxation of the water phase is added.

Further, the free radical is a selective free radical that is able to enhance the NMR signal of the water phase or the oil phase by DNP. If it is required to enhance the NMR signal of the water phase, a selective free radical that is able to enhance the NMR signal of the water phase by DNP is added. If it is required to enhance the NMR signal of the oil phase, a selective free radical that is able to enhance the NMR signal of the oil phase is added.

Compared with the prior art, the invention has the following beneficial effects and advantages.

1. Based on the immiscibility of the oil and water phases, this method takes DNP to selectively enhance the NMR signal of the oil phase or the water phase, which achieves high applicability.

2. This method can improve the sensitivity of NMR signals and the contrast of MRI images. By comparing the MRI images before and after DNP enhancement, this method can directly reflect the distribution of oil and water phases.

3. This method can improve the signal-to-noise ratio of NMR and ensure the reliability of measurement results, and the measurement time is short and the measurement efficiency is high.

Reference numbers are used as referring to the following structure: 1—quartz tube, 2—glass bead.

DETAILED DESCRIPTION OF THE INVENTION

The invention is described in detail with reference to the accompanying drawings.

Example 1

Figure 1:
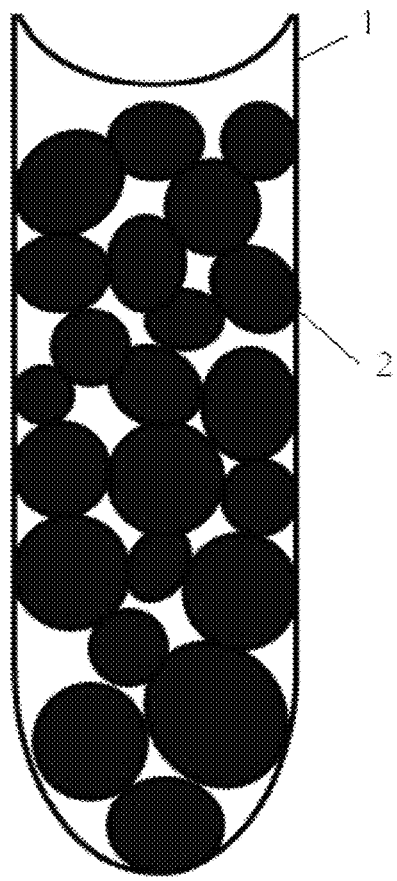
FIG. 1 is a schematic diagram of a glass bead model.

1. A glass bead model is made to simulate a porous material containing oil and water. The glass bead model (as shown in FIG. 1) is made as follows: taking a 10 mm quartz tube 1 having one end open and the other end closed; randomly stacking glass beads 2 with a particle size of 3-5 mm in the 10 mm quartz tube; and soaking the glass beads in the quartz tube layer by layer with water containing a relaxation reagent $MnCl_2$ and a mineral oil containing a free radical TEMPO (2,2,6,6-Tetramethylpiperidine 1-oxyl), wherein the upper layer is an oil phase, and the lower layer is a water phase, the TEMPO can enhance the NMR signal of the oil phase via DNP, and $MnCl_2$ can enhance the relaxation of the water phase, and suppress the DNP-NMR signal of the water phase.

2. The glass bead model is placed in a sample area of a 0.06T DNP magnetic resonance imaging system, where a static magnetic field is provided by a permanent magnet, a resonant cavity used to excite electronic resonance can provide a cylindrical sample space with a diameter of 10 mm and a height of 22 mm, and the glass bead model is located in the center of the magnetic field.

Figure 3:
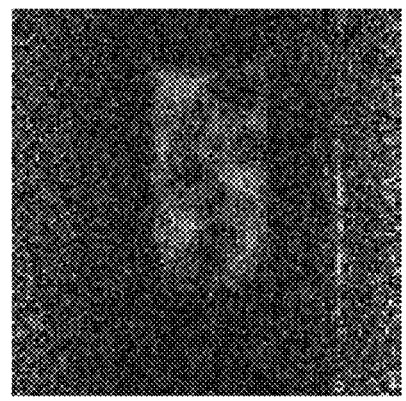
FIG. 3 is an MRI image of a glass bead model without DNP enhancement.

3. A conventional MRI experiment without DNP enhancement is performed as follows:

3.1. setting experimental parameters and starting a test, wherein a spin echo pulse sequence (SE) is used and test parameters were as follows: FOV: 30×30 mm, AcquMatrix=128×128, TE=50 ms, number of scan NS=4; an imaging position is sagittal, and an imaging slice is selected;

3.2. at the end of the experiment, performing image reconstruction, recording a reconstruction result as matrix1, and mapping the reconstruction result to a grayscale image to obtain an MRI image of the glass bead model without DNP enhancement, as shown in FIG. 3.

Figure 2:
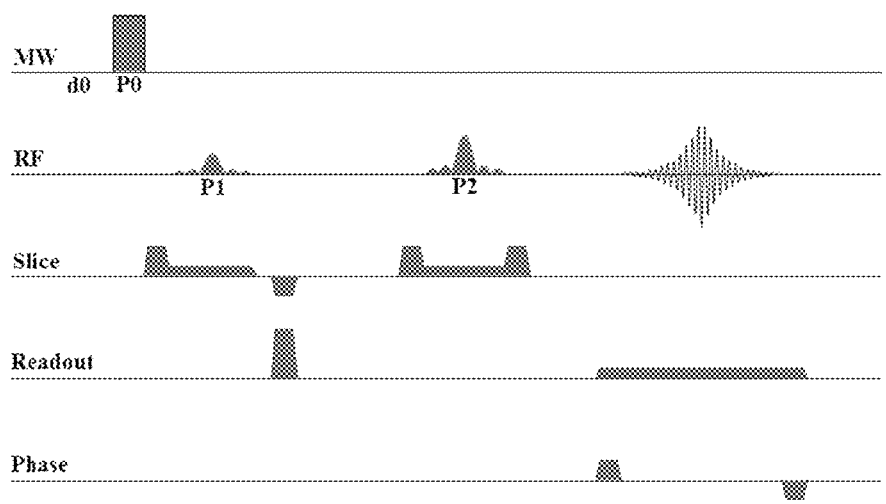
FIG. 2 is a schematic diagram of a spin echo pulse sequence containing microwave excitation.
Figure 4:
FIG. 4 is an MRI image of a glass bead model after DNP enhancement.

4. A DNP-MRI experiment is performed as follows:

4.1. setting experimental parameters and starting a test, wherein a spin echo pulse sequence containing microwave excitation (DNP-SE) is used and as shown in FIG. 2, test parameters are as follows: FOV: 30×30 mm, AcquMatrix=128×128, TE=50 ms, number of scan NS=1, microwave irradiation time is 1 s, and microwave power is 50 W; an imaging position is sagittal, and an imaging slice (consistent with the imaging slice in step 3) is selected;

4.2. at the end of the test, performing image reconstruction, recording a reconstruction result as matrix2, and mapping the reconstruction result to a grayscale image to obtain an MRI image of the glass bead model after DNP enhancement, as shown in FIG. 4.

Figure 5:
FIG. 5 is a difference image between an MRI image of a glass bead model without DNP enhancement and an MRI image of a glass bead model after DNP enhancement.

5. A difference between the reconstruction results matrix1 and matrix2 obtained in step 3.2 and step 4.2 is obtained and mapped to a grayscale image to obtain a difference image, as shown in FIG. 5. An image of the glass bead model without DNP enhancement serves as a reference image and is compared with FIG. 3. As shown in FIG. 4, the MRI signal intensity at the bottom of the quartz tube is greatly reduced or even almost disappears, while the MRI signal at the upper part of the quartz tube is further enhanced rather than being weakened, indicating that the water is distributed at the bottom of the quartz tube and oil is distributed at the upper part of the quartz tube. The grayscale image shown in FIG. 5 is an oil distribution image.

What is claimed is:

1. A method for measuring oil-water distribution using DNP-MRI, comprising:
   (1) adding a free radical for DNP-enhanced NMR signal of a water phase or an oil phase in a sample comprising oil and water;
   (2) performing an MRI on the sample and collecting an MRI image of sample without DNP enhancement;
   (3) applying microwave excitation for a DNP-MRI under same MRI condition as step (2) and collecting an MRI image of the sample after DNP enhancement; and
   (4) comparing the MRI image after DNP enhancement with the MRI image without DNP enhancement,
   wherein in the MRI image after DNP enhancement, an area with enhanced MRI signal intensity is a selectively enhanced fluid phase distribution area, and an area without obviously changed MRI signal intensity is a non-selectively enhanced fluid phase distribution area.

2. The method for measuring oil-water distribution using DNP-MRI according to claim 1, wherein the free radical is a non-selective free radical that is able to simultaneously enhance NMR signals of both the water phase and the oil phase;
   if only the NMR signal of the water phase needs to be enhanced, a relaxation reagent that is able to enhance relaxation of the oil phase is added; and
   if only the NMR signal of the oil phase needs to be enhanced, a relaxation reagent that is able to enhance relaxation of the water phase is added.

3. The method for measuring oil-water distribution using DNP-MRI according to claim 1, wherein the free radical is a selective free radical that is able to enhance the NMR signal of the water phase or the oil phase by DNP;
   if it is required to enhance the NMR signal of the water phase, a selective free radical that is able to enhance the NMR signal of the water phase by DNP is added; and
   if it is required to enhance the NMR signal of the oil phase, a selective free radical that is able to enhance the NMR signal of the oil phase is added.

* * * * *